United States Patent
Alkan

(10) Patent No.: US 8,462,479 B2
(45) Date of Patent: Jun. 11, 2013

(54) SURGE PROTECTION DEVICE WITH IMPROVED RESPONSE TIME

(75) Inventor: Erdogan Alkan, Fayetteville, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 715 days.

(21) Appl. No.: 12/567,122

(22) Filed: Sep. 25, 2009

(65) Prior Publication Data

US 2011/0075312 A1 Mar. 31, 2011

(51) Int. Cl.
*H02H 9/06* (2006.01)

(52) U.S. Cl.
USPC ............................................... 361/119

(58) Field of Classification Search
None
See application file for complete search history.

(56) References Cited

U.S. PATENT DOCUMENTS

| | | | |
|---|---|---|---|
| 4,158,185 A | 6/1979 | Dageforde et al. | |
| 4,481,641 A | 11/1984 | Gable et al. | |
| 4,554,608 A | 11/1985 | Block | |
| 4,963,966 A * | 10/1990 | Harney et al. | 725/149 |
| 5,122,921 A | 6/1992 | Koss | |
| 5,352,984 A | 10/1994 | Piesinger | |
| 5,384,603 A | 1/1995 | Strauss et al. | |
| 5,546,005 A | 8/1996 | Rauchwerger | |
| 5,619,251 A * | 4/1997 | Kuroiwa et al. | 725/133 |
| 5,712,755 A | 1/1998 | Glaser et al. | |
| 5,793,590 A | 8/1998 | Vokey et al. | |
| 5,896,265 A | 4/1999 | Glaser et al. | |
| 6,057,873 A | 5/2000 | Adams, III | |
| 6,061,223 A | 5/2000 | Jones et al. | |
| 6,141,194 A | 10/2000 | Maier | |
| 6,144,737 A | 11/2000 | Maruyama et al. | |
| 6,195,245 B1 | 2/2001 | Kobsa | |
| 6,236,551 B1 | 5/2001 | Jones et al. | |
| 6,507,873 B1 | 1/2003 | Suzuki et al. | |
| 6,697,239 B2 | 2/2004 | Pixley et al. | |
| 6,853,526 B1 | 2/2005 | van Saders et al. | |
| 6,975,496 B2 | 12/2005 | Jones et al. | |
| 7,054,127 B1 | 5/2006 | Scearce et al. | |
| 7,061,355 B2 | 6/2006 | Tanaka et al. | |
| 7,082,022 B2 | 7/2006 | Bishop | |
| 7,154,727 B2 | 12/2006 | Ghahary | |
| 7,170,728 B2 | 1/2007 | Mueller | |
| 7,345,864 B2 | 3/2008 | Marland | |
| 7,602,596 B1 * | 10/2009 | Schley-May et al. | 361/119 |
| 8,149,070 B2 * | 4/2012 | Albag et al. | 333/26 |
| 2001/0000985 A1 | 5/2001 | Kobsa | |
| 2004/0264087 A1 | 12/2004 | Bishop | |
| 2005/0207079 A1 | 9/2005 | Tiller et al. | |
| 2008/0080116 A1 | 4/2008 | Qin et al. | |
| 2009/0028320 A1 | 1/2009 | Fuehrer et al. | |
| 2010/0061034 A1 | 3/2010 | Kaplan et al. | |
| 2010/0095344 A1 * | 4/2010 | Newby et al. | 725/125 |
| 2011/0010749 A1 * | 1/2011 | Alkan | 725/127 |
| 2011/0075311 A1 * | 3/2011 | Alkan | 361/119 |
| 2011/0138440 A1 * | 6/2011 | Shafer et al. | 725/151 |

\* cited by examiner

*Primary Examiner* — Stephen W Jackson
*Assistant Examiner* — Angela Brooks
(74) *Attorney, Agent, or Firm* — Schmeiser, Olsen & Watts, LLP

(57) ABSTRACT

A surge protection device with an internal circuitry that protects a premise device from a surge input that arises from a transient event, e.g., a lightning strike. The internal circuitry can comprise a surge path that includes windings, e.g., inductors, and in one embodiment the surge path comprises a first winding and a second winding that is coupled in series to the first winding. The internal circuitry can also comprise a blocking element that is positioned relative to the surge path so that the blocking element receives the surge input before the premise device, wherein the blocking element can be selected so as to isolate the premise device from the surge input.

17 Claims, 3 Drawing Sheets

SURGE PROTECTION DEVICE WITH IMPROVED RESPONSE TIME

FIELD OF THE INVENTION

The present invention is directed to surge protection, and in particular embodiments, to a surge protection device that utilizes a single pathway to pass transmissions and to block surge inputs.

BACKGROUND OF THE INVENTION

Community antenna television ("CATV") systems provide a premise with many services including, but not limited to, Internet service, telephone service (e.g., voice-over-Internet protocol ("VOIP") telephone), television service, and music service. Each of these services requires the CATV system and the premise to exchange bandwidth, such as, for example, radio frequency ("RF") signals, and digital signals, among many others. Typically the CATV system is configured to use bandwidths that are separated from one another for the purpose of grouping transmissions, and more often the grouping is by the direction that the transmission are transmitted or received in the CATV system. That is, transmissions that have one frequency may be transmitted or received relative to the premise and/or the head-end of the CATV system in a direction that is different from transmissions that have a second frequency. As one example, transmissions that originate from the head-end facility and are transmitted to the premise are referred to herein as a downstream bandwidth, while transmissions that originate from the premise and are transmitted to the head-end facility are referred to herein as an upstream bandwidth.

FIG. 1 illustrates one example of a CATV system 100 that includes a head-end facility 102 and a local network 104, which are connected to the head-end facility 102 by distribution lines 106. The local network 104 includes a feed tap 108, a drop-line 110, and a portion 112 with a premise 114. The premise 114 is connected to the head-end facility 102 via the combination of the distribution line 106, the feed tap 108, and the drop-line 110. The system 100 further includes a downstream bandwidth 116 and an upstream bandwidth 118, both of which are discussed in more detail below.

Typically the downstream bandwidth 116 and the upstream bandwidth 118 are defined by upper and lower cutoff frequencies. Exemplary frequencies for the downstream bandwidth 116 are more than about 54 Mhz, and in one application can be from about 54 Mhz to about 1002 Mhz. Frequencies for use as the upstream bandwidth 118 are less than about 40 Mhz, and in one application can be from about 5 Mhz to about 40 Mhz.

The terms "downstream bandwidth," and "upstream bandwidth" are used herein to generally describe some of the transmissions that are transmitted, exchanged, and manipulated within systems such as the CATV system 100. As is inherent in systems such as system 100, these terms are used in a manner that describes any number of transmissions. Moreover, each of the transmissions that are described by these terms may exhibit properties that are similar to, or different from, other the properties of other transmissions. These other transmissions can also be classified by the terms "downstream bandwidth," and/or "upstream bandwidth" as used in connection with the various embodiments of the present invention that are disclosed, described, and contemplated herein.

In addition to CATV systems, systems that are configured similar to the system 100 of FIG. 1 include, but are not limited to, other uni-directional, and bi-directional communication systems that communicate with remote premises, e.g., premise 114. Similar systems may conduct the transmissions via transmission lines, e.g., distribution lines 106, and drop lines 110. Transmission lines of the type used as the transmission lines are typically transmission-carrying conductors such as, for example, coaxial cable, shielded cable, multi-core cable, ribbon cable, and twisted-pair cable, among others.

Premises that are connected to the system 100 such as the premise 114 include, for example, homes, apartments (e.g., individual apartments, and/or townhomes), and businesses. These premises can have any number of devices and or appliances (collectively, "premise devices") that are coupled either directly or indirectly to the drop-line 110. Techniques and equipment that are used to connect each of the individual premise devices to the head-end facility 102 are generally well-known to those familiar with CATV systems, and therefore a detailed discussion is not provided for purposes of the present discussion.

The premise devices can include, but are not limited to, modems, desktop computers, notebook computers, televisions, gaming consoles, set-top-boxes (STB), and set-top-units (STU), among many others. These are generally configured to communicate with the head-end facility 102, via the downstream bandwidth 116 and the upstream bandwidth 118. For example, the premise devices typically receive the downstream bandwidth 116 from the head-end facility 102, and can transmit the upstream bandwidth 118 to the head-end facility 102.

During periods of normal operation, systems such as the CATV system 100 conduct transmissions that are found within the frequency bands discussed above. It is recognized, however, that the scope, construction, and general breadth of the CATV system 100 makes these systems susceptible to transient events such as, for example, lightning strikes, power outages, and switching events. These transient events can generate inputs (hereinafter, "surge inputs") that fall outside of the frequency bands for the upstream bandwidth and the downstream bandwidth. Moreover, it is common that the transient events can generate surge inputs that fall into frequency bands that are below 1 Mhz. For example, if a component of the CATV system is struck by lightning, the surge inputs typically have a frequency that is less than about 1 Mhz, and energy levels that are sufficient to damage the premise devices.

Surge inputs like the ones discussed above are harmful to many electrical components, and particularly harmful to premise devices that are connected to the CATV system. It is therefore preferable to provide some type of surge protection device, which is designed to prevent damage to the premise device. However, a prerequisite for any such surge protection device is that it should also pass transmissions that are found in the desired frequency bands, such as, for example, the frequency bands of the downstream bandwidth and the upstream bandwidth.

Many surge protection devices are implemented in series between the part of CATV system where the surge input originates and the premise devices. Unfortunately, these devices typically do not prevent the surge input from reaching the premise device. Rather the devices (e.g., gas discharge tubes ("GDTs") and/or metal oxide varistors ("MOVs")) are invariably constructed with a built-in delay, or response time. This delay allows the surge input to momentarily reach the premise device before the device is fully activated to completely protect the premise device from the surge input. Such delay is inherently detrimental because the slower the response time, the more likely it is that damage will occur to the premise device.

Therefore, a surge protection device is needed that can prevent the surge input from reaching the premise device, and more particularly, a surge protection device is needed that it is fully activated so as to provide complete protection from the surge input. It is also desirable that the surge protection device is constructed in a manner so as to increase its life expectancy, and to reduce the need for maintenance and/or replacement after the transient event occurs in the CATV system.

SUMMARY OF THE INVENTION

Embodiments of the present invention are configured so as to prevent the surge input from reaching the premise device, while these embodiments also permit the transmissions that are in the favorable bandwidths to reach the premise device. As contemplated herein, and discussed in more detail below, the devices that incorporate the concepts of the present invention respond to surge inputs significantly faster than MOVs and GDTs, e.g., by isolating the premise devices from the surge inputs in a manner that prevents damage to the premise device.

In one embodiment, the present invention embodies a surge protection device for protecting a premise device from a surge input originating from a CATV system. The surge protection device can comprise a first circuit comprising a main line having a premise side, and a head-end side for receiving a downstream bandwidth, and a second circuit coupled to the main line. The second circuit can comprise a surge path for transmitting the surge input to a ground. The surge protection device can further comprise a blocking element coupled between the surge path and the premise device, wherein the blocking element can block the surge input from reaching the premise device.

In another embodiment, a signal conditioning device configured to isolate a premise device from a surge input in which the signal conditioning device can comprise a main line for transmitting a downstream bandwidth from a head-end facility to the premise device. The device can also comprise a surge path coupled to the main line, the surge path comprising a first winding and a second winding coupled in series with the first winding, wherein the surge input passes through the first winding and the second winding to the ground. The device can further comprise a blocking element coupled in series between the surge path and the premise device, wherein the blocking element receives the surge input before the premise device.

In yet another embodiment, a system for directing a surge input away from a premise device in a premise, in which the system can comprise a surge protection device secured to the premise. The surge protection device can comprise an internal circuitry, wherein the internal circuitry can comprise a main line for transmitting a downstream bandwidth to the premise device, and a surge path coupled to the main line, the surge path comprising a first winding and a second winding coupled in series with the first winding. The device can further comprise a blocking element coupled to the internal circuitry, wherein the blocking element receives the surge input before the premise device, and further wherein the surge input passes through the first winding and the second winding to the ground.

BRIEF DESCRIPTION OF THE DRAWINGS

So that the manner in which the above recited features of the present invention can be understood in detail, a more particular description of the invention briefly summarized above, may be had by reference to the embodiments, some of which are illustrated in the accompanying drawings. It is to be noted, however, that the appended drawings illustrate only typical embodiments of this invention and are therefore not to be considered limiting of its scope, for the invention may admit to other equally effective embodiments. The drawings are not necessarily to scale, emphasis generally being placed upon illustrating the principles of certain embodiments of invention.

Thus, for further understanding of the nature and objects of the invention, references can be made to the following detailed description, read in connection with the drawings in which.

DETAILED DESCRIPTION OF THE INVENTION

There is illustrated and described below a surge protection device, embodiments of which are useful for protecting the premise devices from surge inputs such as the surge inputs generated by lightning strikes in the CATV system. As discussed in more detail below, these devices can comprise a single pathway that is configured not only to pass transmissions between the premise devices and the head-end facility, but also to block the surge inputs and prevent them from generating voltage at the premise device. Such embodiments typically include one or more groups of electrical circuits that are each configured to operate, separately or in conjunction with other electrical circuits, to pass the downstream bandwidth, while also being configured to block the surge input so as to prevent the surge input from damaging the premise devices.

The electrical circuits that are used to implement one or more of the concepts of the present invention are constructed in a manner that interconnect a variety of electrical elements such as, but not limited to, resistors, capacitors, transistors, inductors, transmission lines, and switches. These circuits may further communicate with other circuits (and/or devices), which execute high-level logic functions, algorithms, as well as process firmware, and software instructions. Exemplary circuits of this type include, but are not limited to, field programmable gate arrays ("FPGAs"), and application specific integrated circuits ("ASICs"). While all of these elements, circuits, and devices function individually in a manner that is generally understood by those artisans that have ordinary skill in the CATV arts, it is their combination and integration into functional electrical groups and circuits that generally provide for the concepts of the present invention that are disclosed and described herein.

Figure 1:
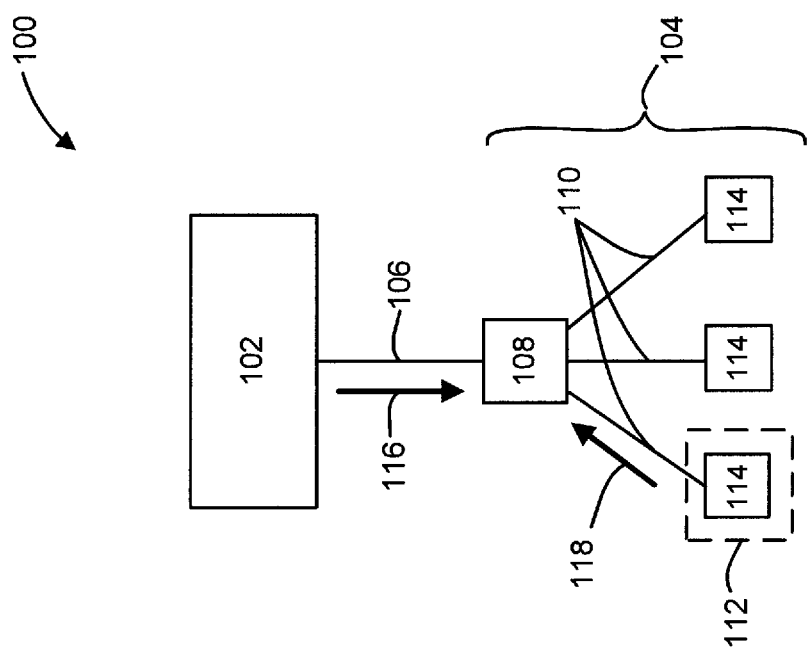
FIG. 1 is a schematic diagram of a cable television (CATV) system that includes one example of a surge protector that is made in accordance with concepts of the present invention.

In addition to the electrical circuits that are described above, as well as the other embodiments of the surge protection devices that are provided in FIGS. 2-3 and described in detail below, it is likewise practical that the concepts of the present invention are implemented as part of, or in combination with, other signal processing devices that are used to connect the premise with the head-end facility 102 (FIG. 1) of the CATV system 100 (FIG. 1). This may include devices that condition the upstream bandwidth. This may also include devices that provide signal attenuation, signal processing, and signal amplification of one or both of the upstream bandwidth and the downstream bandwidth. This functionality may be incorporated into the devices provided herein, and also in separate devices that are coupled to, or that otherwise interface with the devices that are made in accordance with the present invention.

Figure 2:
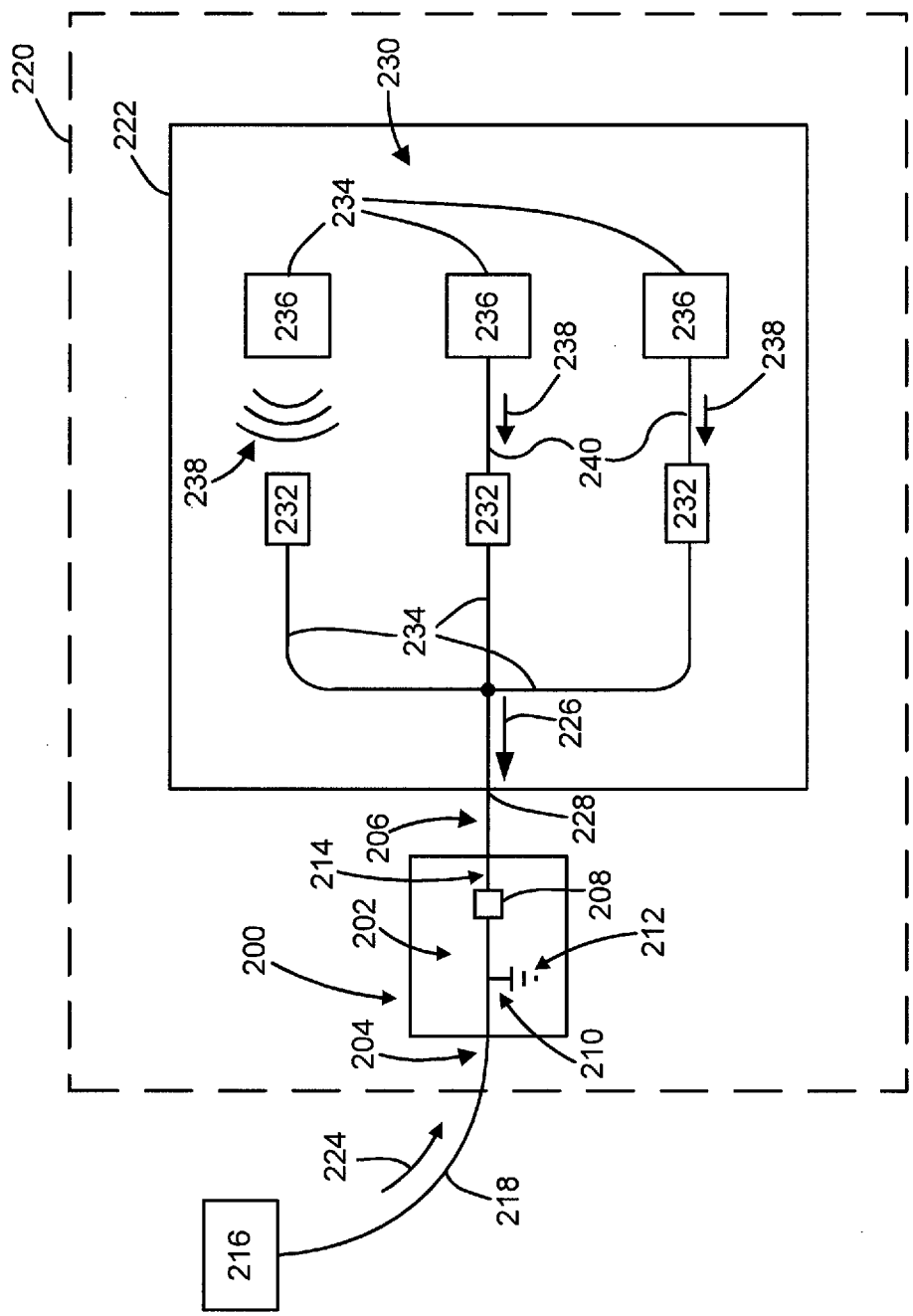
FIG. 2 is a schematic detailed diagram of a portion of a CATV system, such as the CATV system of FIG. 1, that includes an embodiment of a surge protection device that is made in accordance with concepts of the present invention.

In view of the foregoing, and as can be seen in FIG. 2, there is illustrated an example of a surge protection device 200 that is made in accordance with concepts of the present invention. Here, it is seen that the surge protection device 200 can comprise an internal circuitry 202 that has a head-end side 204 and a premise side 206. The internal circuitry 202 can also comprise a blocking element 208, a surge path 210 with a terminated end 212, and a main line 214, which is coupled to the blocking element 208, the surge path 210, as well as the head-end side 204 and the premise side 206.

The premise side 206 is coupled to a feed tap 216 via a drop line 218. The signal conditioning device 200 is positioned in a portion 220 of a system (not shown), and more particularly the premise side 206 is coupled to a premise 222. This configuration is similar to the portion 112 of the system 100 of FIG. 1, described in the Background section above.

The premise 222 receives a downstream bandwidth 224, and generates an upstream bandwidth 226, which is discussed in more detail below. The premise 222 includes a head-end access point 228, and an internal wiring system 230 with a plurality of input ports 232, and a plurality of lines 234, which connect the head-end access point 228 with each of the input ports 232. The premise 222 may also have a number of signal operative devices 234 that includes several premise devices 236 that generate a transmission 238.

The premise 222 further includes connective cables 240 that connect the premise devices 236 to, e.g., the input ports 232. The transmissions 238 are carried by one or more of the lines 234 towards the head-end access point 228, and exit the premise 222 at the head-end access point 228. Exemplary transmissions that the transmission 238 can be include, but are not limited to, transmissions from modems, set-top-boxes, televisions, computers, and any combination thereof.

It is shown in FIG. 2 that the surge protection device 200 can be secured to the outside of the premise 222 such as, for example, to the outside of a home, apartment, office building, and the like. In other implementations, however, the surge protection device 200 is configured so that it can be positioned inside of the premise 222. This configuration includes positions inside of the premise 222 where the surge protection device 200 can receive the downstream bandwidth 224 before it is transmitted to the premise devices 236.

The terms "head-end side" and "premise side" are used to refer to opposite ends of an element or object, e.g., the surge protection device 200 and/or the internal circuitry 202, and do not limit the scope and extent of the present disclosure. Rather, and as discussed in connection with the surge protection devices that are contemplated by the present disclosure, parts of the surge protection devices are configured so that they receive the surge input before other parts of the surge protection device. While generally being defined as the relative location between these parts, it will in some embodiments include one part of the surge protection device 200, e.g., the head-end side 204, which receives the downstream bandwidth 224 (including the surge input) before another part of the surge protection device 200, e.g., the premise side 206.

The internal circuitry 202 is constructed so that the surge protection device 200 can isolate the premise device 236 from the surge inputs, without disrupting the communication between the head-end facility (e.g., the head-end facility 102 (FIG. 1)) and the premise device 236. This communication includes transmissions that are found in the bandwidth of both the downstream bandwidth 224 and the upstream bandwidth 226. For example, surge protection devices of the type contemplated herein can be constructed to accommodate a very broad bandwidth. That is, embodiments of the surge protection device 200 can accommodate bandwidths that may be greater than 2000 Mhz, with one particular construction of the surge protection device in this range set being constructed to accommodate from about 5 Mhz to about 2000 Mhz.

Although a variety of constructions can be used to embody the concepts that are contemplated by the present disclosure, it may be desirable that the main line 214 comprises cables and conducting devices such as coaxial cable, optical cable, as well as other conducting devices consistent with the transmissions being conducted in the particular application, e.g., the CATV system 100 (FIG. 1). The surge path 210 can also comprise similar cables, as well as other electrical elements, and/or electrical circuits that can communicate the transmissions between the head-end side 204 and the premise side 206. Exemplary elements can include, for example, inductors and similar windings that can conduct the surge inputs, as well as the transmissions of the downstream bandwidth 224 and upstream bandwidth 226. The surge path 210 is also configured, however, to dissipate the surge input that is found in the downstream bandwidth 226. This function can, in one example, be accomplished by providing the surge path 210 with a ground, and in one particular construction the surge path 210 can comprise a pair of windings in series with the ground.

Used in conjunction with the surge path 210, the blocking element 208 can be configured to prevent the surge inputs from generating energy that can damage the premise device 226. That is, the blocking element 208 can be selected so as to block the surge input from reaching a load, e.g., the premise device 226. Suitable blocking elements for use as the blocking element 208 can block surge inputs that can cause damage. These blocking elements can also permit transmissions such as radio frequency ("RF") signals to pass through to the premise device 226. This selective passage can be accomplished using a suitably designed electrical circuit, which comprises one or more electrical elements such as a capacitor, a resistor, a transistor, an inductor, and any combinations thereof. Details of one construction of internal circuitry for use as the internal circuitry 202 is provided in connection with the embodiment of the surge protection device that is illustrated in FIG. 3 and described below.

Figure 3:
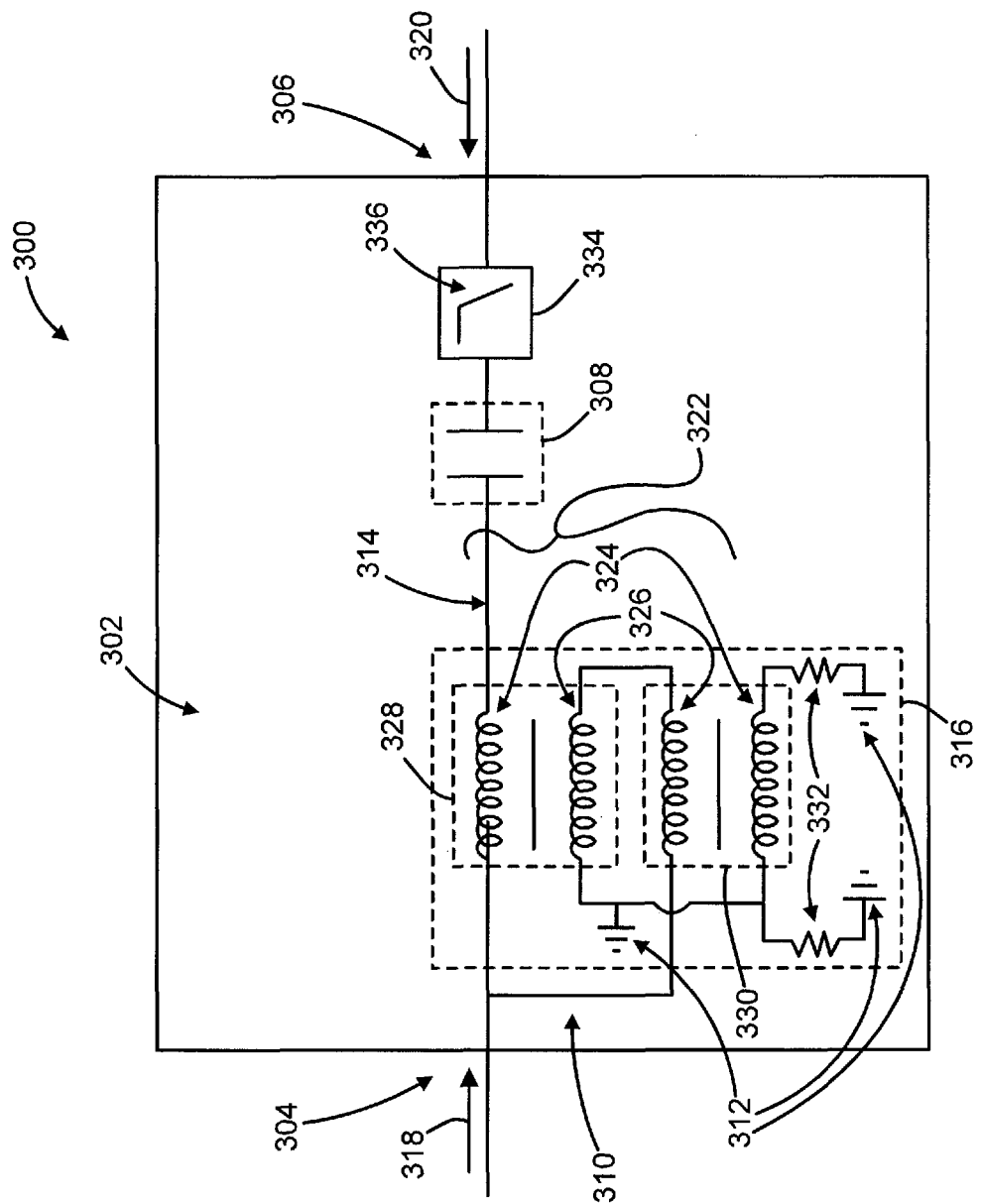
FIG. 3 is a schematic diagram of another example of a surge protection device for use in a CATV system, such as the CATV system of FIG. 1.

For example, and with reference to FIG. 3, another embodiment of a surge protection device 300 is illustrated. Here it is seen that the surge protection device 300 can comprise an internal circuitry 302, a head-end side 304, a premise side 306, a blocking element 308, a surge path 310 with a ground 312, and a main line 314. The surge path 310 can also comprise a directional coupler 316 such as an RF directional coupler, which is coupled to the main line 314 so as to permit transmission of a downstream bandwidth 318, and an upstream bandwidth 320 between the head-end side 304 and the premise side 306. The directional coupler 316 comprises a plurality of windings 322. The windings 322 comprise a pair of outer windings 324, and a pair of inner windings 326 that are coupled to the surge path 310. In one embodiment, the windings 322 can be arranged as one or more RF transformers, such as a first RF transformer 328 and a second RF transformer 330.

The surge protection device 300 can also comprise a plurality of resistors 332, which in the present example are coupled to the ground 312, as well as to one or more of the windings 322. The surge protection device 300 can further comprise at least one filter device 334, which is coupled to the main line 314. The filter device 334 can comprise a filter circuit 336, such as, but not limited to, a low pass filter, a high pass filter, a bandpass filter, and any combinations thereof. In one example, the filter circuit 334 is positioned so that it receives the downstream signal 318 after the blocking element 308, and it receives the upstream signal 320 before the blocking element 308.

By way of non-limiting example, resistance for each of the resistors 328 is selected so that the surge protector 200 exhibits a value of characteristic impedance. This value can be consistent with the value of characteristic impedance of the main line 314, which can be one of about 500 Ohm, about 75 Ohm, and about 900 Ohm. In one example, the resistance of the resistors 328 can be selected in a manner that results in the desired characteristic impedance.

It may be desirable that the directional coupler 316 is constructed for use with a bandwidth of at least about 3000 Mhz, with one construction being compatible with bandwidths from about 5 Mhz to about 2000 Mhz. It is contemplated, however, that a variety of configurations and constructions are possible for the directional coupler 316 so that the surge protection device 300 is made in accordance with the concepts, scope and spirit of the present disclosure. For example, the directional coupler 316 can comprise a pair of RF transformers 334, where each of the RF transformers 334 comprises one of the outer windings 324 and one of the inner windings 326. Examples of suitable transformers for use as the RF transformers 334 include, but are not limited to, a Ruthoff transformer, a Guanella transformer, a Marchand transformer, a Balun transformer, and any combinations thereof.

The blocking element 308 is typically positioned so that it receives the surge input after the directional coupler 316. The blocking element 308 is likewise positioned so that it receives the upstream bandwidth 320 before the directional coupler 316. As discussed above, blocking elements of the type that are used as the blocking element 308 are generally selected so that, when placed in series with the directional coupler 316, the blocking element 308 isolates the premise device, e.g., the premise device 236 (FIG. 2).

Preferably, but not necessarily, the blocking element 308 passes the downstream bandwidth 318 that is received at the head-end side 304 to the premise side 306. In a preferred construction of the surge protector 300 the blocking element 308 also passes the upstream bandwidth 320 received at the premise side 306 to the head-end side 304. Capacitors are suited for use as the blocking element 308. Of course, any structure and/or constructions that include a pair of electrodes and a dielectric that is disposed in between the dielectric are also suitable for use as the blocking element 308.

Discussing the operation of the surge protection device 300 in more detail, it is contemplated that the device 300 is configured to pass the upstream bandwidth 320 from the premise side 306 to the head-end side 304. The device 300 is likewise configured to pass the downstream bandwidth 318 from the head-end side 304 to the premise side 306. These features allow the premise devices (not shown) to communicate with the head-end facility (not shown). In one embodiment, these features are facilitated by the use of the directional coupler 316, in which the downstream bandwidth 318, and the upstream bandwidth 320 can be transmitted via the surge path 310, and inductively coupled across the windings 322 so as to facilitate passage between the head-end side 304 and the premise side 306. In the event that surge inputs are generated in the system (not shown), the device 300 is configured to block the surge inputs from causing damage to the premise devices. In one embodiment, this feature is facilitated by the blocking element 308, and more particularly the blocking element 308 is selected so as to block the surge input long enough for the surge input to dissipate through the windings 322 of the directional coupler 316, and to a level that it can no longer damage the premise devices.

It is contemplated that numerical values, as well as other values that are recited herein are modified by the term "about", whether expressly stated or inherently derived by the discussion of the present disclosure. As used herein, the term "about" defines the numerical boundaries of the modified values so as to include, but not be limited to, tolerances and values up to, and including the numerical value so modified. That is, numerical values can include the actual value that is expressly stated, as well as other values that are, or can be, the decimal, fractional, or other multiple of the actual value indicated, and/or described in the disclosure.

While the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. A surge protection device for protecting a premise device from a surge input originating from a CATV system, said surge protection device comprising:
   a first circuit comprising a main line having a premise side, and a head-end side for receiving a downstream bandwidth;
   a second circuit coupled to the main line, the second circuit comprising a surge path for transmitting the surge input to a ground;
   a blocking element coupled between the surge path and the premise device, the blocking element for receiving the surge input before the premise device, wherein the blocking element is selected to block the surge input long enough for the surge input to dissipate in the surge path to the level that it can no longer damage the premise device; and
   a directional coupler coupling the main line and the surge path, wherein the surge input passes through directional coupler to the ground.

2. A surge protection device according to claim 1, wherein the surge path comprises a first winding and a second winding coupled in series with the first winding, and wherein the surge input passes through the first winding and the second winding to the ground.

3. A surge protection device according to claim 1, further comprising an RF transformer coupling the surge path and the main line, wherein the surge path is coupled to the RF transformer so as to cause the surge input to pass through the RF transformer to the ground.

4. A surge protection device according to claim 1, wherein the directional coupler exhibits a value of characteristic impedance that is the same as a value of characteristic impedance for the main line.

5. A surge protection device according to claim 1, wherein the directional coupler comprises a plurality of windings, wherein the surge path comprises one or more of the windings, and wherein the surge input passes through the windings to the ground.

6. A surge protection device according to claim 1, further comprising a filter circuit coupled to the main line between the blocking element and the premise device.

7. A surge protection device according to claim 6, wherein the filter circuit comprises one or more of a low pass filter, a high pass filter, a bandpass filter, and a bandstop filter.

8. A signal conditioning device configured to isolate a premise device from a surge input, said signal conditioning device comprising:
   a main line for transmitting a downstream bandwidth from a head-end facility to the premise device;
   a surge path coupled to the main line, the surge path comprising a first winding and a second winding coupled in series with the first winding, wherein the surge input passes through the first winding and the second winding to the ground;
   a blocking element coupled in series between the surge path and the premise device, the blocking element receiving the surge input before the premise device, wherein the blocking element is selected to block the surge input long enough for the surge input to dissipate in the first and second windings to the level that it can no longer damage the premise device; and
   a directional coupler coupled to the main line, the directional coupler comprising the first winding and the second winding.

9. A signal conditioning device according to claim 8, further comprising a filter device coupled to the main line, wherein the filter device is positioned so as to receive the surge input after the blocking element, and before the premise device.

10. A signal conditioning device according to claim 8, further comprising a first RF transformer coupling the main line and the surge path, wherein the first RF transformer comprises a first inductor selected from one of the first winding and the second winding.

11. A signal conditioning device according to claim 10, further comprising a second RF transformer coupled to the first RF transformer, wherein the second RF transformer comprises a second inductor selected one of the first winding and the second winding, and wherein the second inductor is different from the first inductor.

12. A signal conditioning device according to claim 8, wherein the blocking element comprises a dielectric material.

13. A signal conditioning device according to claim 8, wherein the blocking element comprises a capacitor.

14. A system for directing a surge input away from a premise device in a premise, the system comprising:
   a surge protection device secured to the premise, the surge protection device comprising an internal circuitry, the internal circuitry comprising,
      a main line for transmitting a downstream bandwidth to the premise device,
      a surge path coupled to the main line, the surge path comprising a first winding and a second winding coupled in series with the first winding,
   a blocking element coupled to the internal circuitry, the blocking element receiving the surge input before the premise device,
   wherein the surge input passes through the first winding and the second winding to the ground, wherein the blocking element is selected to block the surge input long enough for the surge input to dissipate in the first and second windings to the level that it can no longer damage the premise device and
   wherein the internal circuitry comprises a directional coupler coupling the main line and the surge path, and wherein the surge input passes through the directional coupler to ground.

15. A system according to claim 14, wherein the directional coupler comprises one of the first winding and the second winding.

16. A system according to claim 14, wherein the blocking element comprises a capacitor.

17. A system according to claim 14, wherein the surge path is inductively coupled to the main line.

* * * * *